(12) United States Patent
Tsujimura et al.

(10) Patent No.: US 7,115,448 B2
(45) Date of Patent: Oct. 3, 2006

(54) THIN FILM TRANSISTOR, LIQUID CRYSTAL DISPLAY DEVICE AND METHOD OF FABRICATING THE THIN FILM TRANSISTOR

(75) Inventors: Takatoshi Tsujimura, Fujisawa (JP); Osamu Tokuhiro, Shiga-ken (JP); Mitsuo Morooka, Kawasaki (JP); Takashi Miyamoto, Chofu (JP)

(73) Assignee: AU Optronics Corporation, Hsinchu (TW)

( * ) Notice: Subject to any disclaimer, the term of this patent is extended or adjusted under 35 U.S.C. 154(b) by 47 days.

(21) Appl. No.: 10/833,754

(22) Filed: Apr. 28, 2004

(65) Prior Publication Data

US 2004/0203195 A1    Oct. 14, 2004

Related U.S. Application Data

(62) Division of application No. 10/331,699, filed on Dec. 30, 2002, now Pat. No. 6,753,550, which is a division of application No. 09/620,116, filed on Jul. 20, 2000, now Pat. No. 6,525,341.

(30) Foreign Application Priority Data

Aug. 20, 1999   (JP)   ................................. 11-233920

(51) Int. Cl.
   *H01L 21/00*   (2006.01)
   *H01L 21/84*   (2006.01)
(52) U.S. Cl. ...................... 438/149; 438/161; 438/197; 257/E51.005; 257/E33.004
(58) Field of Classification Search ................ 438/197, 438/149, 142, 150, 151, 161, 166, FOR. 138, 438/FOR. 155, FOR. 200, FOR. 201, 174, 438/183; 257/52, 58, 65, 61, E51.005, E33.004
See application file for complete search history.

(56) References Cited

U.S. PATENT DOCUMENTS

| 5,349,205 | A |   | 9/1994 | Kobayashi et al. |
| 5,648,293 | A | * | 7/1997 | Hayama et al. ............. 438/485 |
| 5,811,328 | A | * | 9/1998 | Zhang et al. ............... 438/166 |
| 5,840,602 | A |   | 11/1998 | Han et al. |
| 5,917,564 | A |   | 6/1999 | Kim et al. |
| 6,180,438 | B1 | * | 1/2001 | Deane et al. ............... 438/149 |
| 6,599,790 | B1 |   | 7/2003 | Yamazaki et al. |

FOREIGN PATENT DOCUMENTS

| JP | 6-77483 | 3/1994 |
| JP | 7-45833 | 2/1995 |

(Continued)

*Primary Examiner*—Matthew Smith
*Assistant Examiner*—Quovaunda Jefferson
(74) *Attorney, Agent, or Firm*—Scully, Scott, Murphy & Presser, P.C.

(57) ABSTRACT

The present invention improves a productivity in growing an a-Si film in a thin film transistor and to obtain an excellent thin film transistor characteristic. More specifically, disclosed is a thin film transistor in which an amorphous silicon film 2, a gate insulating film 3 and a gate electrode are sequentially stacked on an insulating substrate 1. The amorphous silicon film 2 includes a low defect-density amorphous silicon layer 5 formed at a low deposition rate and a high deposition rate amorphous silicon layer 6 formed at a deposition rate higher than that of the low defect-density amorphous silicon layer 5. The low defect-density amorphous silicon layer 5 in the amorphous silicon film 2 is grown closer to the insulating substrate 1, and the high deposition rate amorphous silicon layer 6 is grown closer to the gate insulating film 3.

5 Claims, 5 Drawing Sheets

FOREIGN PATENT DOCUMENTS

| | | |
|---|---|---|
| JP | 7-135319 | 5/1995 |
| JP | 8-255917 | 10/1996 |

* cited by examiner

THIN FILM TRANSISTOR, LIQUID CRYSTAL DISPLAY DEVICE AND METHOD OF FABRICATING THE THIN FILM TRANSISTOR

RELATED APPLICATIONS

This application is a divisional of U.S. application Ser. No. 10/331,699 filed on Dec. 30, 2002, now U.S. Pat. No. 6,753,550, which is a divisional of U.S. application Ser. No. 09/620,116, filed Jul. 20, 2000, now U.S. Pat. No. 6,525,341, issued Feb. 25, 2003.

BACKGROUND OF THE INVENTION

1. Technical Field

The present invention relates to a thin film transistor used for an active matrix liquid crystal display, a liquid crystal display device using the thin film transistor, and a method of fabricating the thin film transistor.

2. Prior Art

A liquid display device employing an active matrix system, which uses a thin film transistor, comprises a TFT array substrate in which gate electrodes (Y-electrode) and data electrodes (X-electrode) are arranged in the form of a matrix and thin film transistors (TFT) are disposed at intersceting points of the matrix, and an opposite substrate located so as face the TFT array substrate with a space therebetween. By the thin film transistor, the liquid display device controls a voltage applied to a liquid crystal which is sealed between the TFT array substrate and the opposite substrate, and can performs a displaying utilizing an electro-optic effect of the liquid crystal.

Here, as a structure of the thin film transistor (TFT), a top gate type (positive stagger type) thin film transistor (TET) and a bottom gate type (reverse stagger type) thin film transistor have heretofore been known. In the top gate type thin film transistor, a light shield film is formed on an insulating substrate formed of glass and the like, and an insulating film formed of silicon oxide $SiO_x$, silicon nitride $SiN_x$ and the like is formed on the light shield film. On the insulating film, source electrode and source electrodes formed of an ITO (indium tin oxide) film are formed so as to be apart from each other by a predetermined distance. An amorphous silicon film (a-Si film) is formed so as to cover the source and drain electrodes. A gate insulating film formed of $SiO_x$, $SiN_x$ and the like is formed on the amorphous silicon film. A gate electrode is formed on the gate insulating film. On the other hand, in the bottom gate type thin film transistor, a gate electrode is formed by patterning a metal film deposited on an insulating substrate formed of glass and the like. A gate insulating film formed of $SiN_x$ and the like is formed on the gate electrode. An amorphous silicon film (a-Si film) is grown on the gate insulating film by a CVD method. Thereafter, an a-Si film doped with phosohorus ($n^+$) is grown in a way that phosphine ($PH_3$) is continuously supplied during the growth of the film, and then patterned. Moreover, a film for source and drain electrodes is formed on the a-Si film, and patterned. Thus, the source and drain electrodes are formed.

Here, since a growth rate of the amorphous silicon (a-Si) film is as slow as 500 Å/min in forming the thin film transistor (TFT), acquisition of a sufficient TFT characteristic with an a-Si film of a thickness which is as thin as possible is effective to increase a productivity and to minimize a capital investment.

As prior arts paying attention to the length of a manufacturing time in forming such a-Si film, there exist Japanese Patent Laid-Open No. Hei 6(1994)-77483, No. Hei 7(1995)-45833, No. Hei 7(1995)-135319 and No. Hei 8(1996)-255917. In these gazettes, an a-Si film formed of a low deposition rate film, which takes a long film growth time for growing it, is grown in combination with an a-Si film formed of a high deposition rate film, which takes a short film growth time. More specifically, in the thin film transistors (TFT) taking a bottom gate type structure and a top gate type structure, a good a-Si film (fine a-Si film/low defect-density a-Si film) formed of a low deposition rate film is grown on so-called a channel interface side (gate insulating film side), and a bad a-Si film (coarse a-Si film/high defect-density a-Si film) is grown close to the source and drain electrode side that is a contact portion. According to these films, a tact time can be reduced to half, compared to a length of a general manufacturing time at the time when the a-Si film is formed at a single low deposition rate by a chemical vapor deposition method. In addition, it is possible to prevent deterioration of the a-Si film on the channel interface side which has an effect on electric characteristics and physical and mechanical characteristic, thus preventing deterioration of characteristics of the thin film transistor (TFT).

However, according to these background arts, although the film growth time can surely be shortened, the prior arts are nothing else more than preventing the deterioration of the TFT characteristic such as an electrical characteristic, and the prior arts do not aim at increasing the TFT characteristic. In other words, the object of these prior arts is to shorten: a working time for growing the film under a situation where the deterioration of the TFT characteristic is prevented, and disclose nothing than increasing no deposition rate of the a-Si film on the channel interface side in both of the bottom gate and top gate type TFTs.

As described above, it is required to obtain a sufficient TFT characteristic with an a-Si film of a thickness which is as thin as possible in fabricating the thin film transistor (TFT). On the other hand, in the top gate type TFT, when source and drain electrodes are formed by plasma doping technique, the a-Si film is grown on the $SiO_x$ film formed on the substrate. Accordingly, the a-Si film has a tendency to have a large defect-density due to a lattice mismatching of the a-Si film with the $SiO_x$ film. In order to acquire a sufficient ON characteristic of the thin film transistor (TFT), an a-Si film having a sufficiently thick thickness must be formed so that its film quality is further improved as a distance from the $SiO_x$ film becomes larger. In other words, as the thickness of the deposited a-Si film increases, a lower part of amorphous silicon is annealed in eventually $H_2$ atmosphere and the film quality is improved as the dangling bond of amorphous silicon is terminated by $H_2$. (as the thickness of the deposited a-Si film increases, an influence of lattice mismatching of the amorphous silicon with the silicon oxide on an upper part of the amorphous silicon is reduced, and so-called a hydrogen annealing effect further improving the film quality of the amorphous silicon as the deposition of the amorphous silicon is progressed is exhibited, thus tending to increase an ON current.)

Figure 6:
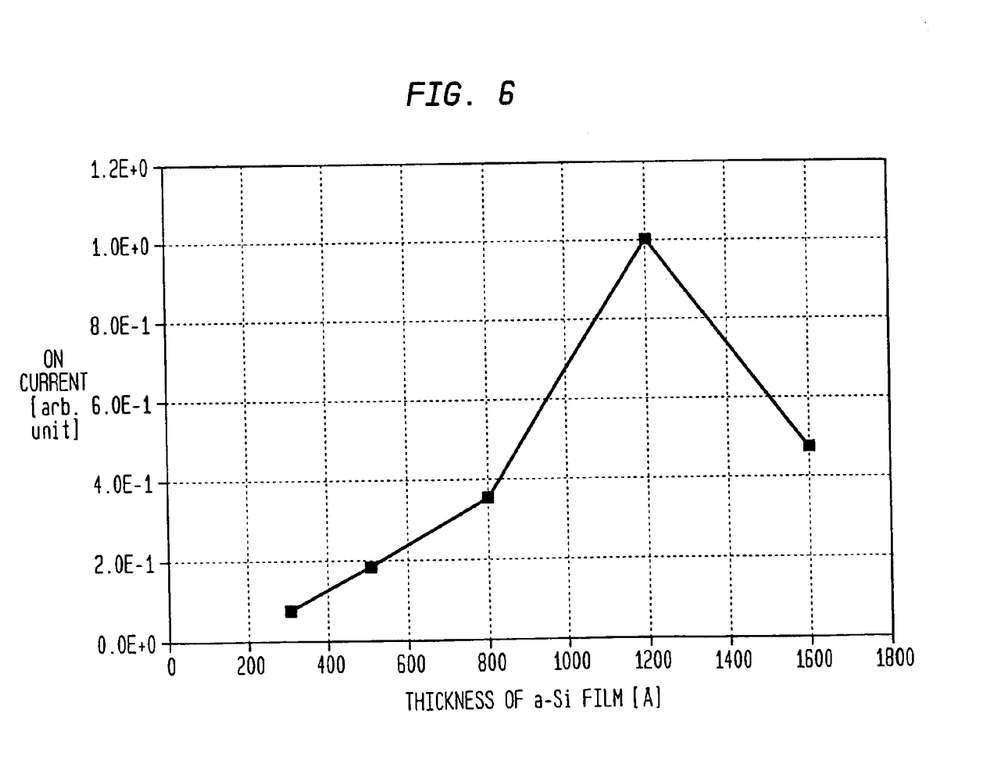
FIG. 6 is a graph showing a film thickness dependency on an ON current in a conventional thin film transistor structure.

FIG. 6 is a graph showing a dependency of the film thickness on the ON current in the conventional TFT structure. In FIG. 6, the axis of abscissa shows the film thickness of the a-Si film, and the axis of ordinates shows the ON current. In the case where the a-Si film formed at a high deposition rate is particularly used, the ON current increases approximately in proportion to the film thickness in a practical use as shown in FIG. 6, so that a thick thickness is required for the a-Si film to obtain a sufficient ON current to drive a liquid crystal device (LCD) including the thin film transistor.

This tendency is shown in the case where a low defect-density amorphous silicon formed at a low deposition rate is used.

However, as a result of investigations by the inventors, the inventors came to recognize the existence of the fact that the ON current decreases as the film thickness of the a-Si film becomes larger. Specifically, although the ON current tends generally to increase as the film thickness of the a-Si film becomes larger, on the contrary the ON current decreases as the film thickness of the a-Si film becomes larger depending on a position of the a-Si film formed and its state. The reason is that as the film thickness of the a-Si film becomes larger, a distance between the channel interface the upper part of the a-Si film in the case of the top gate type thin film transistor TFT) and the source/drain electrode becomes larger, thus increasing a parasitic capacitance. Furthermore, as another reason, the following reason is given. When the Debye length defined by the depth in which electric field has effect on the amorphous silicon is nearly equal to the thickness of the amorphous silicon, the current conduction is dominated by the contact conductance not by the channel conductance, so that the thickness of the a-Si film is almost proportional to the current (current crowding effect) For this reason, employment of a thin a-Si film is sometimes more advantageous to produce a large ON current.

As described above, since the advantage in the case where the thick a-Si film is employed and the advantage in the case where thin a-Si film is employed are in a trade-off relation, in order to produce the maximum ON current, it is necessary to select the optimum position for forming the a-Si film, as well as the optimum thickness of the a-Si film.

In order to solve the above-described problems, the object of the present invention is to increase productivity of a thin film transistor and to produce a high TFT characteristic, by forming a low defect-density a-Si film formed at a low deposition rate at a contact portion.

SUMMARY OF THE INVENTION

Figure 1A:
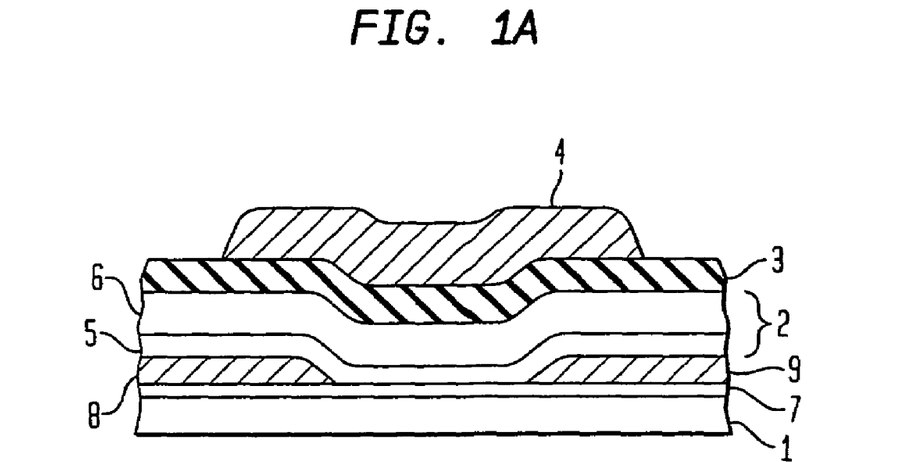
FIGS. 1(a) and 1(b) are explanatory views showing the outline of the present invention.

To achieve the foregoing objects, a thin film transistor of the present invention, as shown in FIG. 1(a), comprises: an amorphous silicon film 2 formed on an insulating substrate 1; a gate insulating film 3 formed on said amorphous silicon film 2; and a gate electrode 4 formed on said gate insulating film 3, wherein said amorphous silicon film 2 includes a low defect-density amorphous silicon layer 5 formed at a low deposition rate, and a high deposition rate amorphous silicon layer 6 formed at a deposition rate higher than that for forming said low defect-density amorphous silicon layer 5, and wherein the low defect-density amorphous silicon layer 5 in said amorphous silicon film 2 is grown close to said insulating substrate 1 and said high deposition rate amorphous silicon layer 6 is grown close to said gate insulating film 3.

In the above-described structure of the thin film transistor of the present invention, the amorphous silicon film 2 is constituted by the low defect-density amorphous silicon layer 5 and the high deposition rate amorphous silicon layer 6, and a thickness of the low defect-density amorphous silicon layer 5 is set to 50 Å or less. Thus, a contact current flowing through the low defect-density amorphous silicon layer 5 is further increased and the low defect-density amorphous silicon layer 5 serves as a buffer layer for the insulating substrate 1.

On the other hand, if the amorphous silicon film 2 is formed in such manner that the low defect-density amorphous silicon layer 5 is formed at a low deposition rate and then the high-deposition rate amorphous silicon layer 6 is formed while increasing the deposition rate gradually, the productivity in forming the amorphous silicon film 2 can be increased and a stable current can be made to flow through the amorphous silicon film 2.

Furthermore, the thin film transistor of the present invention comprises: an insulating film 7 formed on a substrate 1; a source electrode 8 and a drain electrode 9, which are formed on said insulating film 7; and an amorphous silicon film 2 grown on said insulating film 7, said source electrode 8 and said drain electrode 9, wherein said amorphous silicon film 2 includes a low defect-density amorphous silicon layer 5 in a lower portion thereof, said low defect-density amorphous silicon layer 5 serving as a buffer layer for relaxing a lattice mismatching with said insulating film 7.

Here, if the insulating film 7 is formed of silicon oxide ($SiO_x$), it is possible to relax a tendency to increase the defect density of the amorphous silicon film 2 in growing the amorphous silicon film 2 on the silicon oxide ($SiO_x$) film, by providing the low defect-density amorphous silicon layer 5.

Accordingly, since the film quality of the lower part of the phosphorus silicon film 2 is apt to become worse due to an influence of the film under the phosphorous silicon film 2, the lower part of the phosphorous silicon film 2 is formed at a low deposition rate.

Figure 1B:
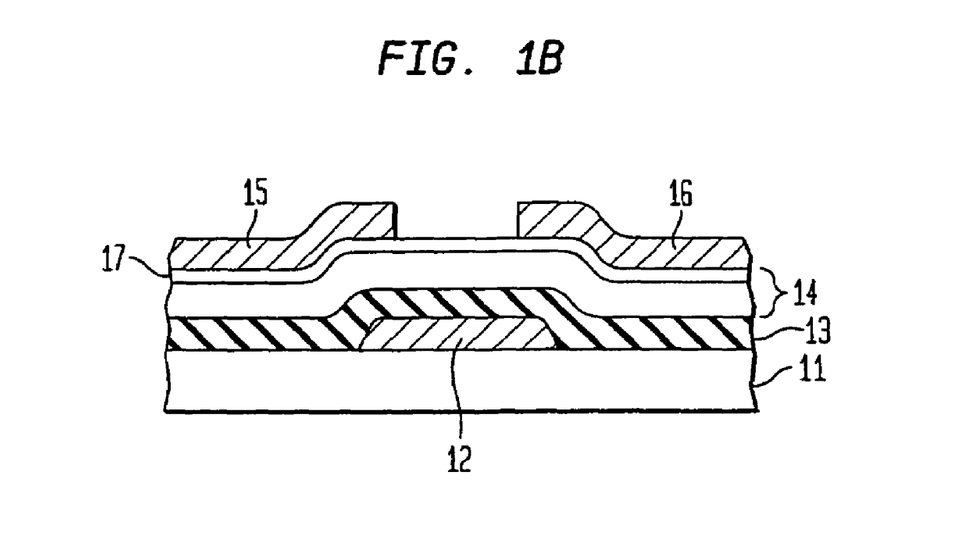

As shown in FIGS. 1(a) and 1(b), a liquid crystal display device of the present invention is a liquid crystal display panel in which an electrode functioning as a pixel and a thin film transistor for applying a voltage to said electrode are formed. In FIG. 1(a), the top gate type thin film transistor in the liquid crystal display panel includes a substrate 1, an insulating film 7 formed on the substrate 1, source and drain electrodes 8 and 9 formed on the insulating film 7, an island-shaped amorphous silicon film 2 formed on the source and drain electrodes 8 and 9, a gate insulating film 3 formed on the amorphous silicon film 1, and a gate electrode 4. The amorphous silicon (a-Si) film 2 is composed of a plurality of layers, which are grown at different deposition rates. The layer in the a-Si film 2, which is closer to the source and drain electrodes 8 and 9, is formed of a low defect-density amorphous silicon layer 5 grown at a low deposition rate. In FIG. 1(b), the bottom gate type thin film transistor in the liquid crystal display panel includes a substrate 11, a gate electrode 12 formed on the substrate 11, a gate insulating film 13 formed on the gate electrode 12, an island-shaped amorphous silicon (a-Si) film 14 formed on the gate insulating film 13, and source and drain electrodes 15 and 16. The amorphous silicon (a-Si) film 14 is composed of a plurality of layers, which are grown at different deposition rates. The layer in the a-Si film 14, which is closer to the source and drain electrodes 15 and 16, is formed of a low defect-density amorphous silicon layer 17 grown at a low deposition rate.

When the liquid crystal display device of the present invention is described in more detail using FIG. 1(a), in the thin film transistor, the insulating film 7 is formed on the substrate 1, the source and drain electrodes 8 and 9 are grown so as to contact the insulating film 7, and the low defect-density amorphous silicon film 5 of the amorphous silicon film 2 is formed at positions which contact the insulating film 7 and the source and drain electrodes 8 and 9, whereby a film quality is improved so that the current conductance is dominated by the channel conductance not by the contact conductance.

When the liquid crystal display device of the present invention is described in more detail using FIG. 1(b), in the thin film transistor, the source and drain electrodes 15 and 16 are formed on the amorphous silicon film 14, and the low defect-density amorphous silicon film 17 in the amorphous silicon film 14 is formed at a position where the low defect-density amorphous silicon film 17 contacts the source and drain electrodes 15 and 16, so that the Debye length is made to be long and the contact current is increased.

A method of fabricating a thin film transistor of the present invention will be described with reference to FIG. 1(a). In the method of fabricating the thin film transistor in which the source and drain electrodes 8 and 9, the island-shaped amorphous silicon film 2 and the gate electrode 4 are sequentially laminated on the substrate 1, the growth of the amorphous silicon film 2 is performed in such manner that the lower layer thereof closer to the source and drain electrodes 8 and 9 and the upper layer thereof closer to the gate insulating film 3 are formed at different deposition rates. Specifically, the lower layer of the amorphous silicon film 2 closer to the source and drain electrodes 8 and 9 is grown at a low deposition rate, and the upper layer thereof is grown at a high deposition rate.

Here, in forming the amorphous silicon film 2, the lower layer of the amorphous silicon film 2, which is a low deposition rate film, is grown to be thin on the source and drain electrodes 8 and 9, and the upper layer of the amorphous silicon film 2, which is a high deposition rate film, is grown to be thick on the low deposition rate film. With such film structure of the amorphous silicon film 2, the productivity of the liquid crystal display device can be increased without degrading the TFT characteristic, and the capital investment can be minimized. Here, if the low deposition rate film is grown at a low growth rate of about 50 Å/min and to a thickness of 50 Å or less, the low deposition rate film preferably can serve as a buffer layer to relax an influence of a lattice mismatching of the a-Si film with the insulating film 7.

In forming the amorphous silicon film 2, the deposition rate film is grown on the source and drain electrodes 8 and 9, and the deposition rate film is grown on the low deposition rate film while gradually increasing the deposition rate. With such film structure of the amorphous silicon film 2, an influence of the lattice mismatching of the a-Si film with the insulating film 7 is absorbed by the low deposition rate film. By growing the high deposition rate film at the high deposition rate, the film growth time can be made to be faster. Accordingly, it is possible to improve electrical characteristics and physical properties of the thin film transistor, and moreover it is possible to shorten the film growth time. This multistage film growth can be performed in multistage processes, in addition to two stage processes. For example, it is possible to increase the film growth rate gradually every time the film is grown by 50 Å, thus forming the amorphous silicon film 2 of a thickness of about 500 Å in total. By adopting such film structure of the amorphous silicon film 2, as a film quality changes, it is possible to change film growth conditions, and the film growth rate can be increased, in addition to promotion of so called a channel characteristic-depending rule.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

An embodiment 1 of the present invention will be described with reference to the accompanying drawing in detail.

Figure 2:
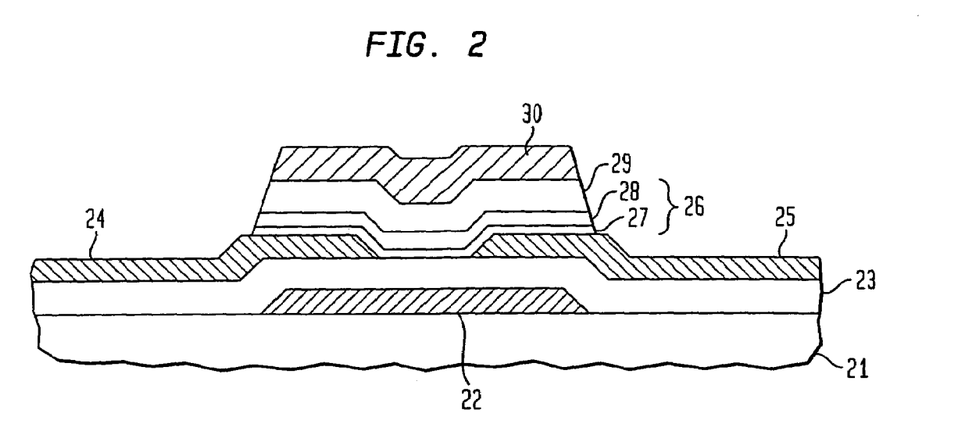
FIG. 2 is an explanatory view showing a structure of a thin film transistor in an embodiment of the present invention.

FIG. 2 is an explanatory view showing a structure of a thin film transistor in this embodiment 1. Specifically, FIG. 2 shows a top gate type (positive stagger) TFT structure. In FIG. 2, reference numeral 21 denotes an insulating substrate formed of no-alkali glass, quartz and the like. A light shield film 22 formed of Mo alloy such as Mo and MoCr is provided on the insulating substrate 21. An insulating film 23 formed of silicon oxide $SiO_x$, silicon nitride $SiN_x$ and the like, which serves as an under coat layer, is provided so as to cover the upper portion of the light shield film 22. A pixel electrode (not shown) formed of an ITO (indium tin oxide) film, which is a transparent conductive film, is formed on the insulating film 23. Source and drain electrodes 24 and 25, which are formed integrally with the pixel electrode by laminating metal films such as molybdenum tungsten alloy using Mo, Ti, Ta, Cr, Nb, W, Ag and the like, are formed on the ITO film by patterning.

An amorphous silicon (a-Si) is deposited on the source and drain electrodes 24 and 25 and the region of the insulating film 23 between the source and drain electrodes 24 and 25, and then patterned, so as to form an amorphous silicon film (a-S film) 26 as a semiconductor layer. In this embodiment 1, this a-Si film 26 is composed of a low defect-density amorphous silicon layer (low defect-density a-Si layer) 27 which is grown at a low rate (low deposition rate), shows a low defect-density and is excellent in a film quality, and a high deposition rate amorphous silicon layer (high deposition rate a-Si layer) 28 which is grown at a high rate (high deposition rate), shows a comparatively high defect-density and is poor in the film quality. A gate insulating film 29 composed of a first silicon nitride ($SiN_x$) film and a second silicon nitride ($SiN_x$) film serving as a passivation film is deposited on the a-Si film 26. A gate electrode 30 formed of metal such as Cr and Al is formed on the gate insulating film 29.

Here, the structure of the a-Si film 26 will be described in more detail. The a-Si film 26 is formed by a plasma CVD method, in which $SiH_4$ particles are moved in plasma atmosphere to form the a-Si film. In forming the a-Si film 26, the low defect-density a-Si layer 27 formed of a-Si exhibiting an excellent film quality is first formed with a low power at a low SiH$_4$ flow rate. The low defect-density a-Si layer 27 is formed at a low growth rate of about 50 Å/min, and its thickness is about 50 Å. The high deposition rate a-Si layer 28 showing a poor film quality is formed on the low defect-density a-Si layer 27 with a high power at a high SiH$_4$ flow rate. This high deposition rate a-Si layer 0.28 is formed at a growth rate of about 500 Å/min, and its thickness is about 450 Å.

Figure 3:
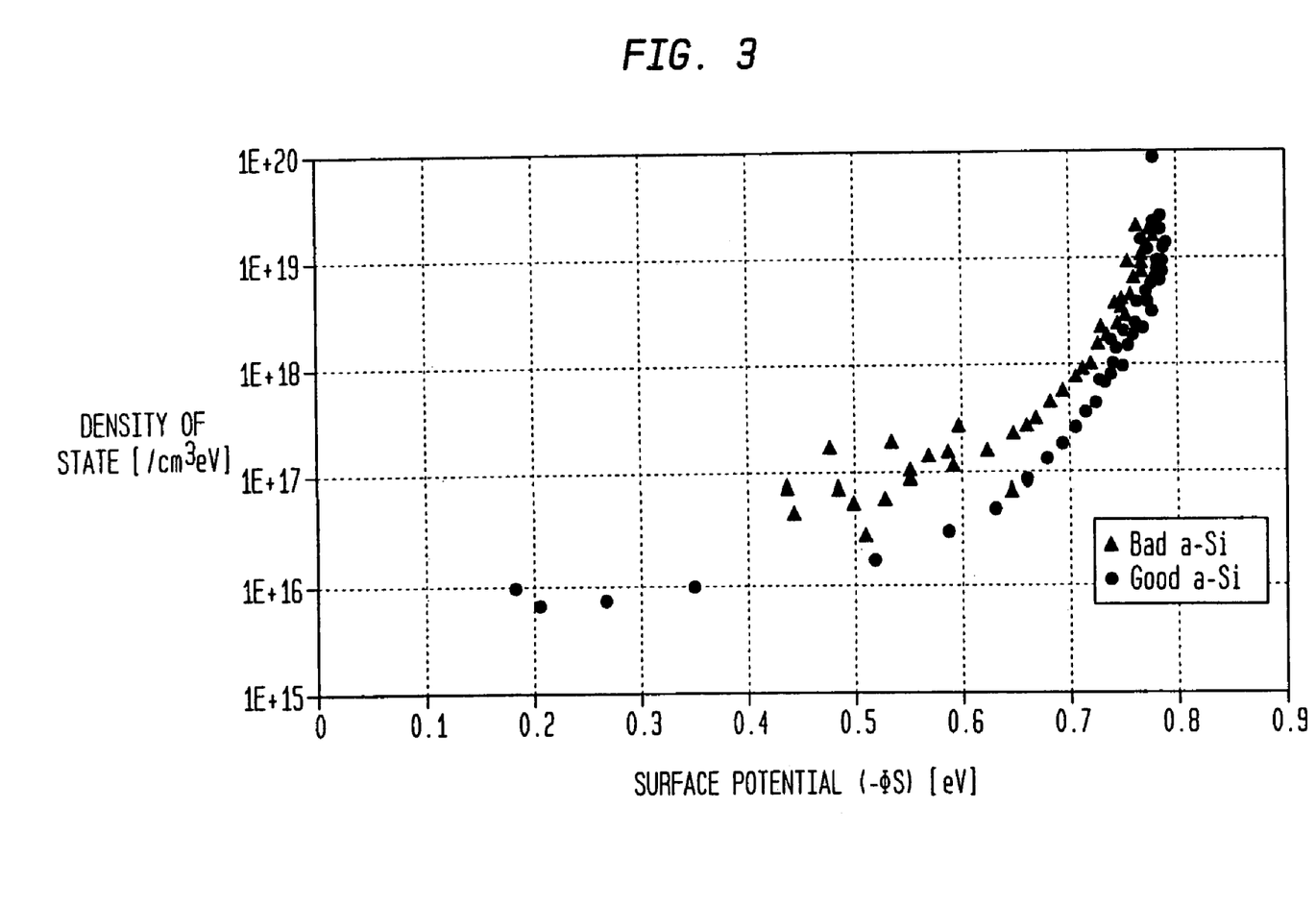
FIG. 3 is a diagram showing an example of a Good a-Si layer and a Bad a-Si layer.

FIG. 3 is a graph showing examples of the a-Si showing a excellent film quality and the a-Si showing a poor film quality. In FIG. 3, the axis of abscissa shows a surface potential, and as the surface potential moves toward the left portion of the axis of abscissa, that is, as the surface potential approaches zero, it has a deeper level. As the surface potential moves toward the right portion of the axis of abscissa, that is, as the surface potential departs from zero, it has a shallower level. On the other hand, the axis of ordinates shows a defect density (defects per unit volume). As shown in FIG. 3, in the portion of the deeper level, that is, in the portion of 0.6 V or less, which shows almost no gradient, the[?]Good a-Si[?]has a low defect density of about 1E17[/cm$^3$ eV], and the[?]Bad a-Si[?]has a high defect density of about 1E18[/cm$^3$ eV]. The difference between the [?]Good a-Si[?]and the [?]Bad a-Si[?]appears as quantitative difference in hydrogen content, refractive index, dielectric constant and the like besides the difference in the defect density.

Figure 4A:
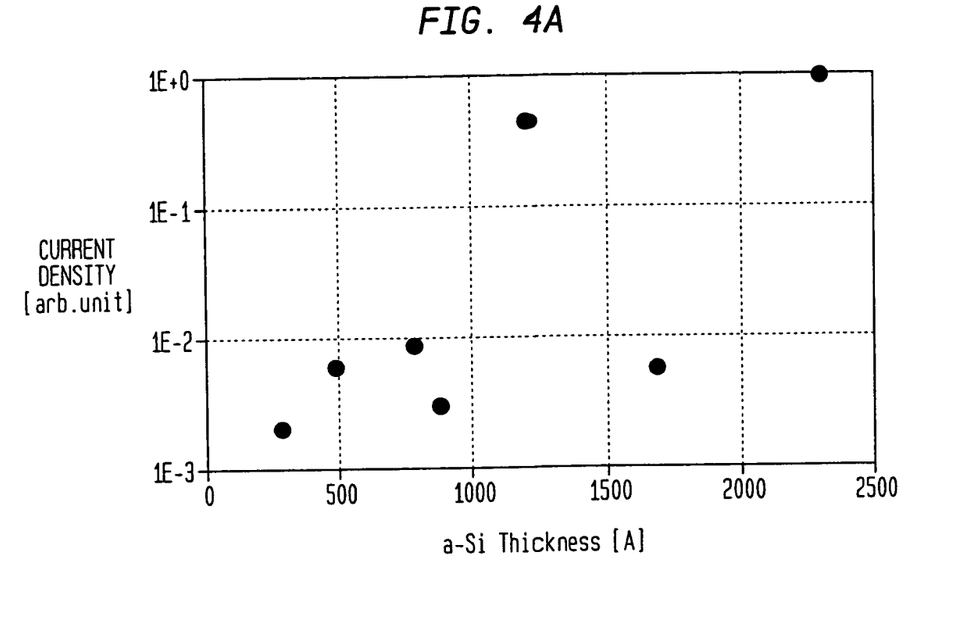
FIGS. 4(a) and 4(b) are graphs showing a current-voltage characteristic in a contact portion.
Figure 4B:
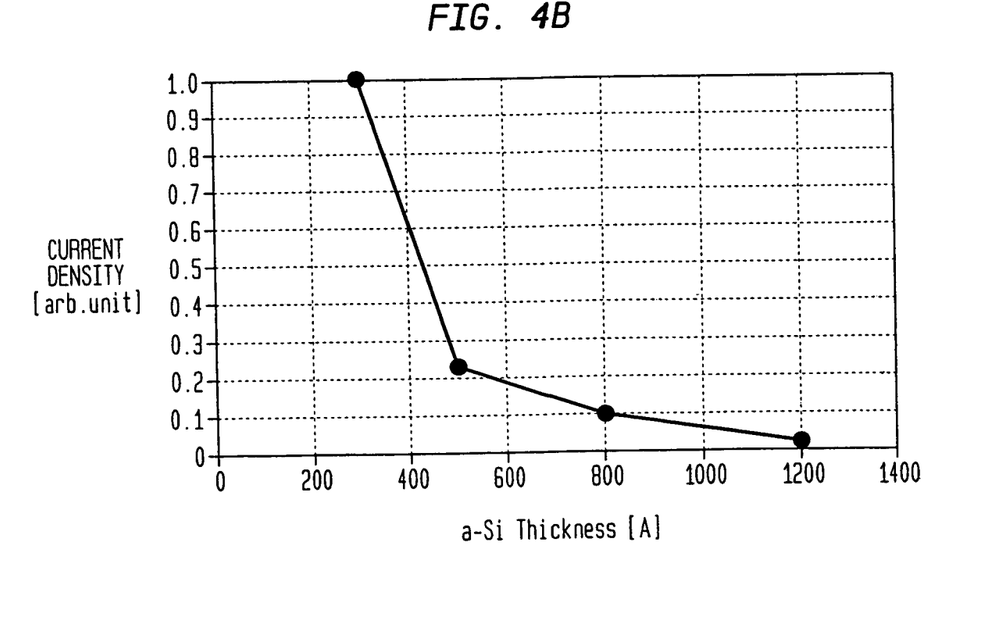

In this embodiment 1, the low defect-density a-Si layer 27 formed of [?]Good a-Si[?]is disposed under the high deposition rate a-Si layer 28 formed of the [?]Bad a-Si[?]. The results of the investigation until such structure is obtained will be described using FIGS. 4(*a*) and 4 (b).

FIGS. 4(*a*) and 4(*b*) are graphs showing a current-voltage characteristic in the contact portion (portion where the source and drain electrodes 24 and 25 contact the a-Si). In FIG. 4(*a*), the low defect-density a-Si is formed on the high deposition a-Si that is the conventional a-Si. In FIG. 4(*b*), the low defect-density a-Si is formed under the high deposition a-Si. In FIGS. 4(*a*) and 4(*b*), the axis of abscissa shows a thickness of the a-Si, and the axis of ordinates shows a contact current value.

In FIG. 4(*a*), the contact current tends to increase with the increasing thickness of the a-Si. This is regarded to originate from that as a result of the presence of the high deposition rate a-Si as a lower layer, the Debye length at the entrance from which current flows' is sufficiently larger than the thickness of the a-Si, and the film quality of the a-Si is improved with its thicker thickness. Specifically, as described above, the influence of the lattice mismatching of the a-Si film with the under layer (insulating film such as SiO$_x$) is reduced by the low deposition rate film, and as the a-Si is deposited, the film quality of the a-Si is improved by a hydrogen annealing effect. However, although the contact current becomes larger by thickening the a-Si, it was impossible to obtain a sufficient TFT characteristic by the a-Si having a small thickness in the structure that the low defect-density a-Si is formed as the upper layer of the conventional a-Si, so that it is difficult to increase the productivity and to minimize the capital investment.

On the other hand, the experiment result in the case where the low defect-density a-Si is grown under the high deposition rate a-Si shows that, as the thickness of the a-Si becomes smaller, the contact current becomes larger astonishingly. In other words, when the low defect-density a-Si is grown closer to the SiO$_x$ film that is the insulating film 23, it is possible to obtain a high contact current value by the low defect-density a-Si having a thin thickness. This is because by growing the low defect-density a-Si under the conventional high deposition rate a-Si, the low defect-density a-Si that is the lower layer of the a-Si serves as a buffer layer, thus relaxing the lattice mismatching of the a-Si with the SiO$_x$. In other words, with the growth of the low defect-density a-Si layer of a thin thickness under the high deposition rate a-Si a current crowding effect is improved, and a good ohmic contact is obtained also in the top gate type TFT structure.

Descriptions of the current crowding effect will be made in detail. In general, upon application of a voltage across the a-Si, a trap center within the a-Si is first charged, the voltage is consumed by charging, so that a distance $\lambda d$ (Debye length) on which the voltage has an effect exists within the a-Si. If the Debye length is shorter than the thickness of the a-Si, no electrons are supplied to the channel, thus producing a situation where no current flows. By improving the film quality, the trapping center is decreased and the Debye length becomes longer. At a point of time when the thickness of the a-Si and the Debye length becomes equal to each other, the current first starts to flow. When the Debye length becomes far longer than the thickness of the a-Si, a very stable current flows, and a good ohmic contact is obtained. Since the contact portion (contact point of the source and drain electrodes) generally exists at the lowest end of the a-Si in the top gate type TFT, the film quality of the contact portion becomes worse, and the Debye length does not become sufficiently long, though the Debye length is longer than the film thickness of the a-Si. Thus, although the contact characteristic becomes worse so that the TFT characteristic is apt to be dominated by the contact conductance, the film quality of the contact portion can be improved by growing the low defect-density a-Si layer to be thin.

Considering such results, in this embodiment, the low defect-density a-Si layer 27 with an excellent film quality is formed is grown to be as thin as about 50 Å as shown in FIG. 2. On the low defect-density a-Si layer 27, the high deposition rate a-Si layer 28 with a poor film quality is grown to be a thickness of about 450 Å. The thickness of about 50 Å of the film thickness of the low defect-density a-Si layer 27 is a preferable level capable of relaxing the lattice mismatching with the SiO$_x$ film, and a preferable level for maintaining the physical property of the a-Si film. As described above, in the top gate type TFT structure, the low defect-density a-Si layer 27 having a thin thickness is grown under the high deposition rate a-Si layer 28, whereby the growth time of the low defect-density a-Si layer 27 can be shortened. Moreover, a productivity in growing the a-Si film can be improved, and an excellent TFT characteristic can be obtained.

In this embodiment, the a-Si film 26 is constituted by the two layer structure composed of the low defect-density a-Si layer 27 and the high deposition rate a-Si layer 28. However, when it is aimed at that the film growth condition is changed in accordance with the change of the quality of the layer to be formed, the number of layers is never limited to two. For example, the film growth condition is stepwise changed every 50 Å in growing the a-Si layer with a poor film quality followed by the growth of the a-Si layer with an excellent film quality, thus growing the a-Si film of 500 Å in total. Also in this case, the film growth condition is changed in accordance with the change of the film quality required. That is, the film growth condition is changed from the low deposition rate to the high deposition rate as the film is grown from the contact side (source and drain electrodes side) to the channel side (gate insulating film side). Thus, the influence of the lattice mismatching of the a-Si film with the $SiO_x$ film is relaxed, and, at the same time, the film growth time is shortened, resulting in an increase in productivity in fabricating the TFT.

Next, fabrication steps of the thin film transistor (TFT) in this embodiment will be described using FIG. 2. First, the insulating substrate 21 such as a glass substrate is washed by means of a mechanical washing such as a brush washing (scrape washing) and a chemical washing using acid, organic solvent or the like. Thereafter, a Mo alloy for light shield is deposited on the insulating substrate 21 to a predetermined thickness, by means of magnetron sputtering. Using a photolithography technique, the Mo alloy is subjected to a photoetching using photoresist as a mask, so as to form a light shield film 22. Subsequently, as an interlayer dielectric, an insulating film 23 formed of a silicon oxide film ($SiO_x$) exhibiting a strong adhesion is grown by a plasma CVD method. Thereafter, an indium tin oxide (ITO) film for the source and drain electrodes and a Mo alloy film for a data bus are continuously formed by magnetron sputtering. After the formation of the indium tin oxide (ITO) film and the Mo alloy film, these films are patterned, so as to form the source and drain electrodes 24 and 25. Furthermore, an indium tin oxide (ITO) film for the pixel electrode is deposited, and patterned, thus the pixel electrode (not shown) is formed. The substrate, on which the source and drain electrodes 24 and 25 made of the ITO film are formed, is subjected to a plasma doping processing by means of a radio frequency (RF) glow discharge of a frequency of 13.5 MHz at an atmosphere of $PH_3$ gas, using a plasma CVD apparatus. At this time, the plasma doping processing is conducted such that the impurities are selectively doped only into the surface of the ITO film.

Next, the a-Si film 26 as a semiconductor material is deposited on the source and drain electrodes 24 and 25 and the portion of the insulating film 23 exposed between the source and drain electrodes 24 and 25 by a plasma CVD method. In this embodiment, the formation of the a-Si film 26 is performed in such manner that the low defect-density a-Si layer 27 that is an excellent film quality a-Si film and the high deposition rate a-Si layer 28 that is a poor film quality a-Si film are separately grown. To be more specific, the low defect-density a-Si layer 27 that is a low deposition rate film is grown for about one minute under the film growth conditions that cyan gas as a raw material is used at a flow rate of 150 SCCM, at a degree of vacuum of 500 mm Torr, at a substrate temperature of 300° C., at a high-frequency power of 100 W, and at a deposition rate of 50 Å/min. After stopping of discharge, the high deposition rate a-Si layer 28 is grown for about 54 seconds using the cyan gas as a raw material. The film growth conditions of the high deposition rate a-Si layer 28 are as follows. A flow rate of the cyan gas is 300 SCCM, a degree of vacuum is 500 mm Torr, a substrate temperature is 300° C., a high-frequency power is 300 W and a deposition rate is 500 Å/min. Thus, the low defect-density a-Si layer 27 can be grown to a film thickness of 50 Å, and the high deposition rate film a-Si layer 28 can be grown to a film thickness of 450 Å.

Thereafter, after the a-Si film 26 composed of the low defect-density a-Si layer 27 and the high deposition rate a-Si layer 28 is patterned to be island-shaped, first and second $SiN_x$ films for the gate insulating film are sequentially grown by a plasma CVD method, and patterned to a predetermined shape, thus forming the gate insulating film 29. Subsequently, aluminum is deposited by sputtering, and patterned to form the gate electrode 30. Thus, the fabrication of the thin film transitoria TFT is completed.

As described above, according to the fabrication steps of the thin film transistor TFT of this embodiment, the TFT characteristic can be improved, and the film growth time of the a-Si film can be shortened, resulting in a reduction in the manufacturing cost of the thin film transistor TFT.

In the descriptions of the embodiment 1 of the thin film transistor, the top gate type TFT structure was described. In this embodiment 2, the descriptions will be made for the bottom gate type TFT structure to which the present invention is applied.

In describing this embodiment, constituent components exhibiting functions essentially identical to those used in the embodiment 1 will be denoted using the same reference numerals, and detailed descriptions for them are omitted.

Figure 5:
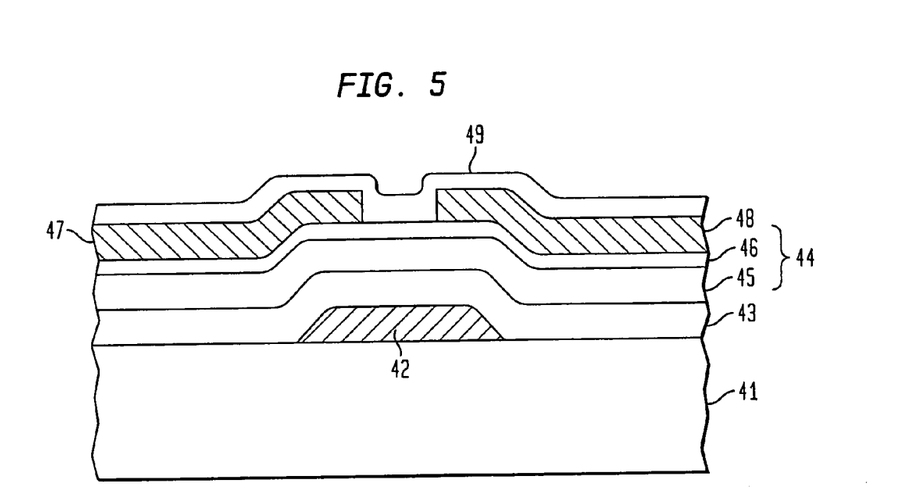
FIG. 5 is an explanatory view showing a thin film transistor structure in an embodiment 2 of the present invention.

FIG. 5 is an explanatory view showing a thin film transistor structure in the embodiment 2. In FIG. 5, reference numeral 41 denotes an insulating substrate formed of no-alkali glass, quartz and the like, and a gate electrode 42 formed of a metal such as Cr, Mo—Ta, Ta and Al is formed on the insulating substrate 41. A gate insulating film 43 is formed on the gate electrode 42, and the gate insulating film 43 has a two layered structure composed of an anodic oxidation insulation film formed of aluminum oxide $AlO_3$ and a $SiN_x$ insulating film. An island-shaped amorphous silicon film (hereinafter referred to as a-Si film) 44 is formed on the gate insulating film 43. In this embodiment, the a-Si film 44 is composed of a high deposition rate amorphous silicon layer (hereinafter referred to as high deposition rate a-Si layer) 45 and a low defect-density amorphous silicon layer (hereinafter referred to as low defect-density a-Si layer) 46 formed on the high deposition rate a-Si film 45. The high deposition rate a-Si film 45 is grown at a high deposition rate, and shows a comparatively high defect density and a poor film quality. The low defect-density a-Si film 46 is grown at a low deposition rate, and shows a low defect density and an excellent film quality. The high deposition rate a-Si layer 45 in the a-Si film 44 has a thickness of about 450 Å, and is grown under the same film growth conditions as those of the low defect-density a-Si layer 27 in the embodiment 1. Subsequently, on the a-Si film 44, a metal film is grown by sputtering or the like, and patterned by dry etching, thus forming source and drain electrodes 47 and 48. Furthermore, a protection film 49 is formed on the source electrode 47 and the drain electrode 48.

The feature of this embodiment to be mentioned is that the a-Si film 44 has the high deposition rate a-Si layer 45 as a lower part layer, which shows a poor film quality, and the low defect-density a-Si layer 46 as an upper part layer, which shows an excellent film quality.

Here, in the thin film transistor TFT of the embodiment 1, the contact portion adjacent to the source and drain electrodes is the lowest end of the a-Si film. Accordingly, the lattice mismatching of the a-Si film with the $SiO_x$ film when the a-Si film is grown on the $SiO_x$ film, the current conduction is apt to be dominated by the contact characteristic-depending rule. For this reason, as described in the embodiment 1, the low defect-density a-Si layer 27 showing an excellent-film quality is formed as a lower part layer of the a-Si film 2, and the lattice mismatching of the a-Si film 2 with $SiO_x$ film is relaxed, thus permitting a stable current flow. On the other hand, in the bottom gate type thin film transistor TFT in this embodiment, since the contact portion adjacent to the source and drain electrodes is the upper end portion of the a-Si film 44, the thin film transistor TFT of this embodiment is never influenced by the lattice mismatching in the growth of the a-Si film 44 as the top gate type thin film transistor. Accordingly, the current conduction is apt to be dominated by the channel characteristic-depending rule. For this reason, there is no problem of the lattice mismatching in growing the a-Si film as the embodiment 1. Also in the prior arts paying attention to an a-Si film of a multi-layered structure, disclosed in Japanese Patent Laid-Open No. Hei 6(1994)-77483, No. Hei 7(1995)-45833, No. Hei 7(1995)-135319 and No. Hei 8(1996)-255917, only an influence on the channel side which is a contact interface with a $SiN_x$ insulating film in a gate insulating film is taken into consideration, and aiming at controlling of the ON resistance in the thin film transistor, a film with an excellent film quality is grown on a channel side.

However, as a result of the earnest investigation by the inventors, it was found that although the current conduction is apt to be dominated by the channel characteristic-depending rule in the bottom gate type thin film transistor, the current conduction is sometimes dominated by the contact characteristic-dependency rule as the film quality is made to be worse. Specifically, even when the film quality is degraded in order to increase the film growth rate, it is possible to lengthnen the Debye length due to a current crowding effect, by providing the a-Si film with an excellent film quality on the contact side. To be more specific a current to charge a trap center within the a-Si layer becomes unnecessary because of providing the a-Si layer with an excellent film quality on the contact portion side, and hence the Debye length can be provided so as to be long. Thus, the channel characteristic-depending rule is apt to dominate the current conduction more strongly.

From such technical background viewpoint, in this embodiment, the high deposition rate a-Si layer 45 showing a poor film quality is provided under the low defect-density a-Si layer 46, and the low defect-density a-Si layer 46 is provided on the high deposition rate a-Si layer 45, that is, on the contact portion side where the source and drain electrodes 47 and 48 are disposed. With such structure, even when the a-Si film 44 is partially grown at a high deposition rate, the current conduction can be dominated by the channel characteristic-depending rule. Thus, similarly to the embodiment 1, a reduction in a manufacturing cost of the thin film transistor and the thin film transistor characteristic can be further improved.

As described above, according to the present invention, the low defect-density a-Si layer grown at a low rate (low deposition rate) is formed in the contact portion, whereby the productivity of the thin film transistor and the excellent TFT characteristic can be achieved.

While the invention has been particularly shown and described with respect to preferred embodiments thereof, it will be understood by those skilled in the art that the foregoing and other changes in form and details may be made therein without departing from the spirit and scope of the invention.

The invention claimed is:

1. A method of fabricating a thin film transistor of a top-gate type, in which source and drain electrodes, an island-shaped amorphous silicon film, a gate insulating film and a gate electrode are sequentially laminated, the method comprising:

forming a first amorphous silicon layer of the island-shaped amorphous silicon film in contact with the source and drain electrodes; and forming a second amorphous silicon layer of the island-shaped amorphous silicon film on the first amorphous silicon layer to contact the gate insulating film, wherein the growth rate of the first amorphous silicon layer is slower than that of the second amorphous silicon layer and the growth rate of the second amorphous silicon layer is about 500 Å/min, so that contact conductance is dominant when the top-gate type thin film transistor is ON to maximize its ON current.

2. The method of claim 1, wherein a growth rate of the first amorphous silicon layer is about 50 Å/min.

3. The method of claim 1, wherein a thickness of the first amorphous silicon layer is thinner than that of the second amorphous silicon layer.

4. The method of claim 1, wherein a thickness of the first amorphous silicon layer is about 50 Å.

5. The method of claim 1, wherein a thickness of the second amorphous silicon layer is about 450 Å.

* * * * *